United States Patent
Hata

[11] Patent Number: 5,880,015
[45] Date of Patent: Mar. 9, 1999

[54] METHOD OF PRODUCING STEPPED WALL INTERCONNECTS AND GATES

[75] Inventor: William Y. Hata, Milpitas, Calif.

[73] Assignee: SGS-Thomson Microelectronics, Inc., Carrollton, Tex.

[21] Appl. No.: 323,262

[22] Filed: Oct. 14, 1994

Related U.S. Application Data

[62] Division of Ser. No. 104,500, Aug. 10, 1993, abandoned, which is a continuation of Ser. No. 693,671, Apr. 30, 1991, abandoned.

[51] Int. Cl.⁶ .................................................. H01L 21/3205
[52] U.S. Cl. ......................... 438/585; 438/666; 438/669
[58] Field of Search ................... 437/44; 438/585, 438/666, 669

[56] References Cited

U.S. PATENT DOCUMENTS

| | | | |
|---|---|---|---|
| 4,472,237 | 9/1984 | Deslauriers et al. | 438/669 |
| 4,617,193 | 10/1986 | Wu | 357/71 |
| 4,764,480 | 8/1988 | Vora | 257/370 |
| 4,818,715 | 4/1989 | Chao | 438/585 |
| 4,905,068 | 2/1990 | Satoh et al. | 357/68 |
| 4,907,048 | 3/1990 | Huang | 357/23.4 |
| 4,917,759 | 4/1990 | Fisher et al. | 438/669 |
| 4,994,873 | 2/1991 | Madan | 357/23.4 |
| 4,996,584 | 2/1991 | Young et al. | 357/65 |
| 5,043,294 | 8/1991 | Willer et al. | 437/39 |
| 5,053,841 | 10/1991 | Miyakawa et al. | 357/23.5 |
| 5,061,975 | 10/1991 | Inuishi et al. | 357/23.4 |
| 5,089,863 | 2/1992 | Satoh et al. | 357/68 |
| 5,100,820 | 3/1992 | Tsubone . | |
| 5,113,238 | 5/1992 | Wang et al. | 257/384 |
| 5,204,285 | 4/1993 | Kakiuchi | 438/669 |
| 5,266,508 | 11/1993 | Azuma et al. | 437/41 |
| 5,384,479 | 1/1995 | Taniguchi | 257/412 |
| 5,578,166 | 11/1996 | Hirota | 438/669 |

*Primary Examiner*—Charles L. Bowers, Jr.
*Assistant Examiner*—Lynne A. Gurley
*Attorney, Agent, or Firm*—Theodore E. Galantha; Kenneth C. Hill; Lisa K. Jorgenson

[57] ABSTRACT

A method is provided for making conductive structures whereby an insulating layer is formed over a substrate. A conductive layer is then formed over the insulating layer. A first photoresist layer is formed over the conductive layer, patterned and developed. The conductive layer is etched after which the first photoresist layer is removed. A second photoresist layer is formed over the integrated circuit, patterned and developed. The remaining regions of the conductive layer forming an interconnect or a gate are partially etched to form two-tiered stepped sidewalls.

26 Claims, 2 Drawing Sheets

METHOD OF PRODUCING STEPPED WALL INTERCONNECTS AND GATES

This application is a divisional of U.S. application Ser. No. 08/104,500, filed Aug. 10, 1993 now abandoned, which was a continuation of U.S. application Ser. No. 07/693,671, filed Apr. 30, 1991 now abandoned, which has been assigned to the assignee hereof and incorporated by reference herein.

FIELD OF THE INVENTION

The present invention relates generally to semiconductor integrated circuit processing, and more specifically to producing stepped sidewall interconnects and gates.

BACKGROUND OF THE INVENTION

With the trend to continue to miniaturize semiconductor integrated circuits to achieve submicron feature sizes, photolithography has become one of the most critical steps in semiconductor manufacturing. The goal of photolithography in establishing the horizontal dimensions of the various devices and circuits is to create a pattern which meets design requirements as well as to correctly align the circuit pattern on the surface of the wafer.

As line widths shrink smaller and smaller in submicron photolithography, the process to print lines in photoresist becomes increasingly more difficult. Photoresists have been developed to keep pace with the industry's need to print narrower lines with fewer defects. The selection of the photoresist must be made on whether the photoresist has the capability of producing the design dimensions. The resist must also be able to function as an etchant barrier during the etching step and be free of pinholes. Furthermore, the selection of photoresist must provide for process latitude and step coverage capabilities.

Exposure light sources are chosen in photolithography based upon the characteristics of the photoresist. Standard production exposure tools used to print lines may limit how small the devices can be made. One problem with standard exposure tools is in the auto focus mechanism used to pattern a wafer. The exposure tools, when used in conjunction with thick photoresists have a small depth of focus so that light focused on the top of the photoresist will be out of focus near the bottom of the photoresist.

Production tools with light sources having longer wavelengths also create negative optical effects such as diffraction. Diffraction reduces the resolution of an image in the photoresist causing poor image definition.

Smaller features can be imaged clearly by using thinner photoresist layers for a given photoresist chemistry and optical tool. Thinner photoresists, however, are not suitable for all masking requirements because of the reduced ability to protect masked areas.

A concern in printing submicron devices is the resultant angle of the step from the top of the photoresist to the bottom of the layer in which the device is being made. If the angle is too steep, subsequently deposited layers may be too thin over the step and not fill in the spaces between adjacent devices. Thus, step coverage problems result.

Step coverage problems have been of prime importance throughout the history of integrated circuit manufacture. Poor step coverage can be found at the sharp vertical step metal to substrate contacts, metal to metal vias, and metal crossovers. On the other hand, there is a concern in printing submicron devices in close proximity to adjacent devices. Design criteria requires controlling the cross sectional lengths of the devices. Control of the cross sectional lengths of devices is best achieved when the sidewall slopes of the devices are 90 degrees. The critical dimension, or cross sectional length, is then a function of the critical dimension of the photoresist. If the sidewall slope is not 90 degrees, other factors must be considered in determining the critical dimension of the device, such as the angle of the sidewall slope, photoresist selectivity and the photoresist critical dimension.

As stated above, however, step coverage problems arise when the angle of the slope forms a steep sidewall. For example, as the height of a vertical or 90 degree sidewall increases, the percent of step coverage decreases. The ratio of the sidewall height to the space between adjacent structures is the aspect ratio. Device structures with high aspect ratios only increase step coverage problems. The spaces between the devices become harder to fill. On the other hand, sloped sidewall structures have an advantage over structures with sidewalls having a 90 degree angle because of a lower aspect ratio.

In order to increase step coverage while maintaining a lower aspect ratio, a two-tiered stepped sidewall is proposed by this invention. The step heights of each tier of the stepped sidewall are kept at a minimum, thus lowering the equivalent aspect ratio while increasing step coverage.

It would be desirable to provide a method for printing interconnects and gates having stepped sidewalls to enhance step coverage using thin photoresists. It would be further desirable for such fabrication technique to provide stepped sidewall profiles for use with small device geometries by lowering aspect ratios. It would be further desirable for such method to be compatible with current process technologies.

SUMMARY OF THE INVENTION

Therefore, according to the present invention, a method is provided for making submicron interconnects and transistor gates by forming an insulating layer over a substrate and a conductive layer over the insulating layer. The conductive layer is etched to form two-tiered stepped sidewalls.

BRIEF DESCRIPTION OF THE DRAWINGS

The novel features believed characteristic of the invention are set forth in the appended claims. The invention itself, however, as well as a preferred mode of use, and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
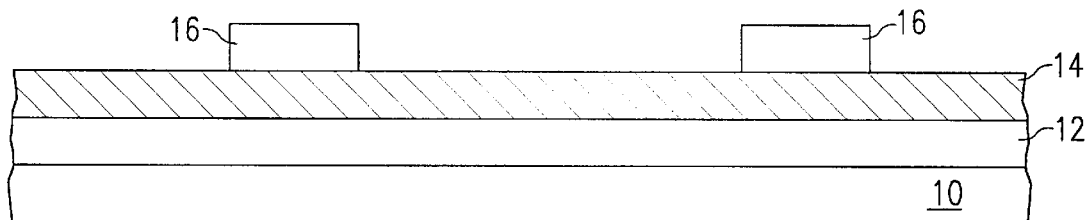
FIGS. 1–9 illustrate one method for forming integrated circuit structures according to the present invention.

Referring to FIG. 1, an integrated circuit device is to be formed in a silicon substrate 10. Selected regions of the substrate 10 are oxidized to form an oxide insulating layer 12. A conductive layer 14 is deposited over the insulating layer 12 by methods known in the art. The conductive layer 14 may a metal or a polysilicon. A first layer of photoresist 16 is formed on the conductive layer. Photoresist layer 16 is then patterned and developed.

Figure 2:
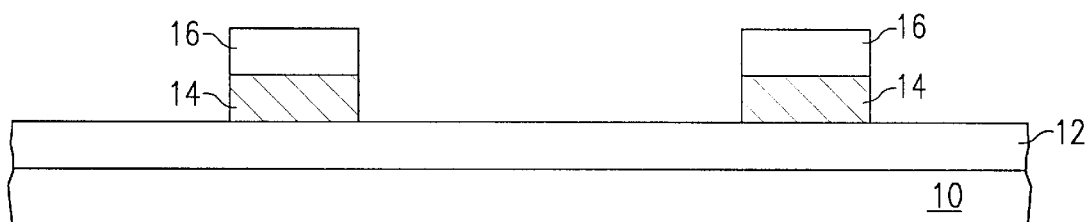

Referring to FIG. 2, conductive layer 14 is then etched by methods known in the art, using photoresist layer 16 as a mask. Among the various devices manufactured, conductive layer 14 may be used as an interconnect or as the gate of a field effect transistor. Photoresist layer 16 is then stripped away.

Figure 3:
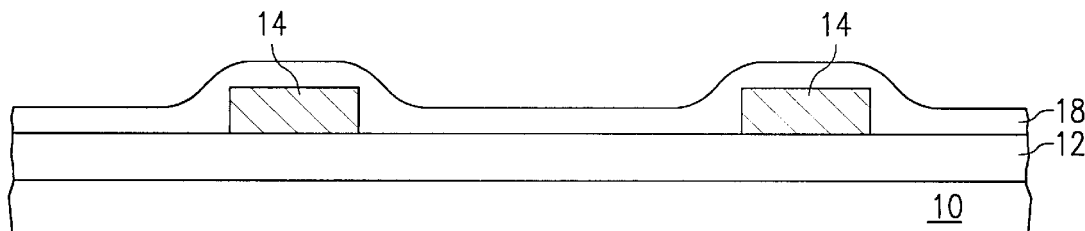

Referring to FIG. 3, second photoresist layer 18 is spun onto the wafer again by known methods covering the remaining regions of conductive layer 14 and the exposed regions of insulating layer 12. Photoresist layers 16 and 18 typically have a thickness of less than 1.2 microns and preferably between approximately 0.1 and 0.5 microns. In order to adequately protect masked areas, one photoresist layer may need to be thicker than the other photoresist layer.

Figure 4:
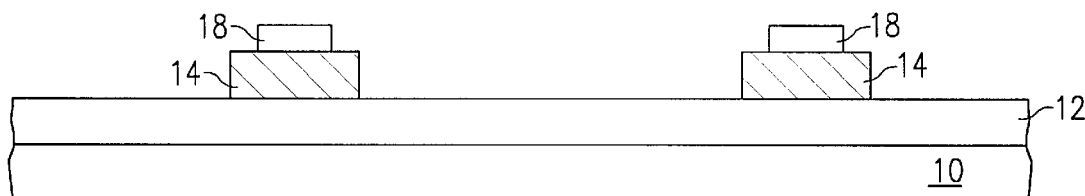
Figure 5:
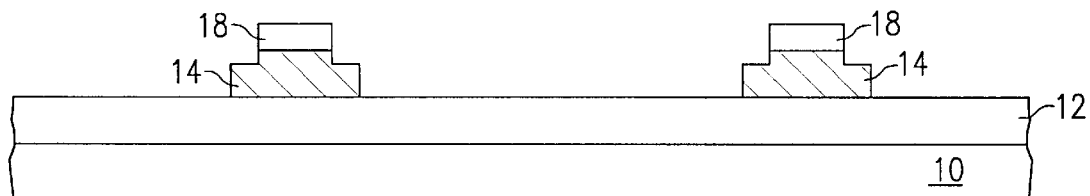

Referring to FIG. 4, photoresist layer 18 is patterned and developed by methods known in the art. The pattern of the second photoresist layer 18 is smaller than the pattern of the first photoresist layer 16. The remaining conductive layer 14 regions are then partially etched using photoresist layer 18 as a mask to form the two-tiered stepped sidewalls as shown in FIG. 5.

Figure 6:
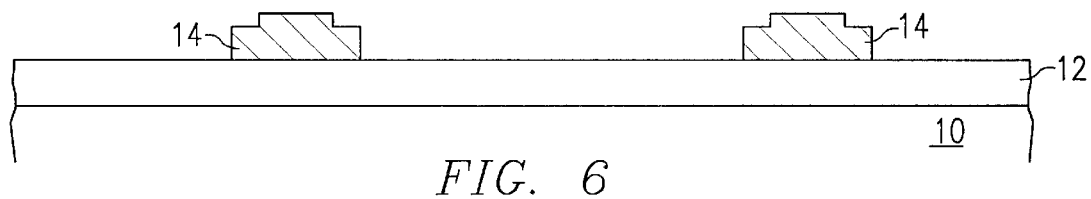

Referring to FIG. 6, photoresist layer 18 is stripped away leaving the interconnect or gate device structure shown. The height of each vertical section of the two-tiered stepped sidewalls will be smaller than the total height of the device. Thus, step coverage will improve over the device and the aspect ratio will be lowered.

Figure 7:
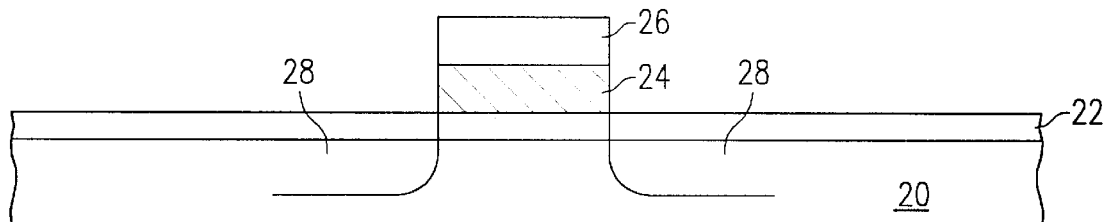

If a gate of a field effect transistor is to be manufactured, the additional steps necessary to manufacture source and drain regions of the transistor need to be implemented during or after the manufacture of the gate. Referring to FIG. 7, the process steps are the same as above as shown in FIGS. 1–2. An insulating layer 22 is grown on substrate 20. A conductive layer 24 is deposited on insulating layer 22. A first photoresist layer 26 is spun onto the conductive layer 24, patterned and developed. Conductive layer 24 is then etched using photoresist layer 26 as a mask. The source and drain regions are created using two different implantation steps as known in the art. The first implantation step occurs after removing the first photoresist layer 26. Source and drain regions 28 are formed by heavily doping insulating layer 22. The dopant used during these implantation steps may be either N-type or P-type.

Figure 8:
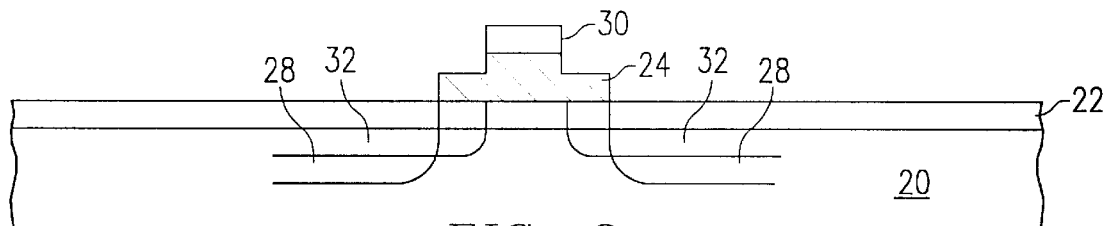
Figure 9:
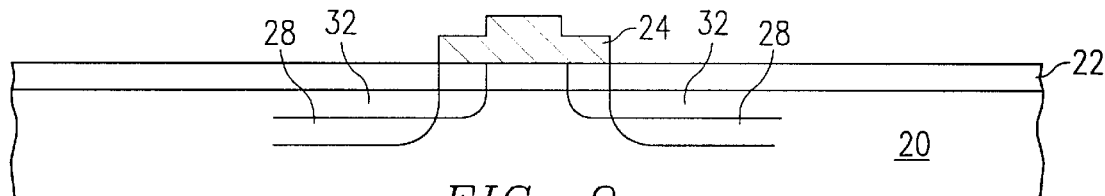

Referring to FIG. 8, a second photoresist layer 30 is then spun onto the remaining regions of conductive layer 24 and the exposed regions of insulating layer 22. Photoresist layer 30 is patterned and developed. Conductive layer 24, which forms the gate of a field effect transistor, is then etched to form the two-tiered stepped sidewalls using photoresist layer 30 as a mask. Insulating layer 22 and substrate 20 are lightly doped after the second photoresist layer 30 is removed to form a second source/drain region 32 underneath the step of the conductive layer 24. Again, either N-type or P-type dopants may be used to minimize resistance of these regions. An alternative to implanting dopants at two different stages of the process to form the source/drain regions is to form both source/drain regions 28 and 32 after conductive layer 24 is partially etched to form the two-tiered stepped sidewalls. No sidewall oxide spacers are required in using either alternative in this process to create the source/drain regions. Referring to FIG. 9, the gate device shown as conductive layer 24 is formed with first and second source/drain regions 28 and 32.

Figure 10:
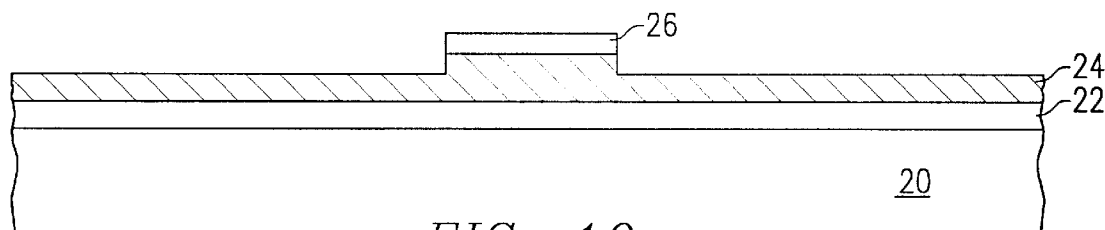
FIGS. 10–12 illustrate an alternate method for forming integrated circuit structures according to the present invention.

Referring to FIG. 10, an alternative method of producing a structure with stepped sidewalls is shown. As above, insulating layer 22 is formed on substrate 20 and conductive layer 24 is formed on insulating layer 22. Photoresist layer 26 is formed on conductive layer 24, patterned and developed. Conductive layer 24 is then etched partway through using photoresist layer 26 as a mask. Photoresist layer 26 is then removed. Sidewall oxide spacers 34 are then formed by methods known in the art at the step of conductive layer 24. Conductive layer 24 is then further etched using sidewall oxide spacers 34 as a mask. If the structure to be manufactured is an interconnect, the sidewall oxide spacers 34 are removed to form the structure shown in FIG. 6.

Figure 11:
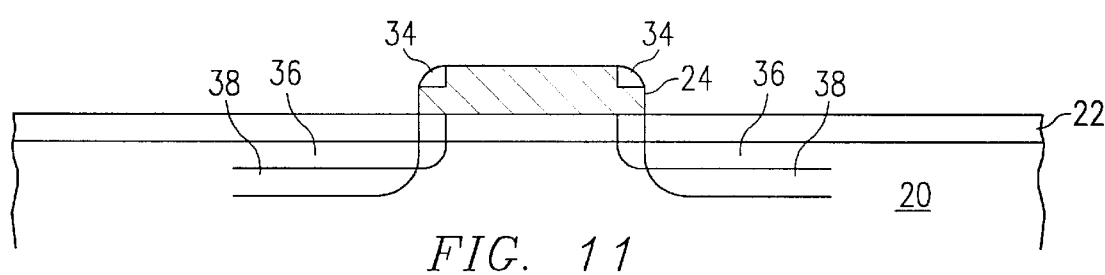
Figure 12:
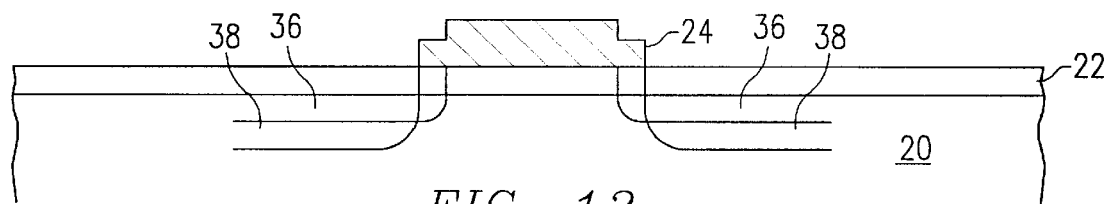

Referring to FIG. 11, where a gate of a field effect transistor is to be made, two implantation steps are necessary to form source/drain regions 36 and 38. Source/drain regions 36 are first formed by lightly doping the substrate 20 after photoresist layer 26 is removed. Source/drain regions 38 are then formed by heavily doping the substrate 20 after the final etching step of conductive layer 24 and before the sidewall oxide spacers 34 are removed. The sidewall oxide spacers 34 are then removed to form the structure shown in FIG. 12.

This alternative allows a single thin layer of photoresist to clearly image the device, providing for self-alignment. Moreover, by forming sidewall oxide spacers, the source/drain regions of a gate can be easily formed.

Submicron devices, such as interconnects and gates, can be produced with sufficient control to allow for short distances between adjacent devices, if the sidewalls have a 90 degree angle. By forming a two-tiered stepped sidewall using thin photoresists to clearly image the devices, the equivalent aspect ratio is minimized and step coverage maximized allowing the distances between devices to be minimized.

What is claimed is:

1. A method of producing a conductive structure of a semiconductor integrated circuit having stepped walls, comprising the steps of:

forming an insulating layer over a substrate;

forming a conductive layer over the insulating layer;

forming a first photoresist layer over the conductive layer;

patterning the first photoresist layer;

etching the conductive layer to completely remove portions not covered by the patterned first photoresist layer and to form a remaining conductive layer;

forming a second photoresist layer over the remaining conductive layer and the insulating layer;

patterning the second photoresist layer;

partially etching the remaining conductive layer to form a step; and, removing the second photoresist layer.

2. The method of claim 1, wherein the step of etching the conductive layer to completely remove portions forms an interconnect.

3. The method of claim 1, wherein the step of etching the conductive layer to completely remove portions forms a gate.

4. The method of claim 3, wherein the substrate is heavily doped after removing the first photoresist layer step to form a first source/drain region and lightly doped after removing the second photoresist layer step to form a second source/drain region.

5. The method of claim 4, wherein the dopants are N-type dopants.

6. The method of claim 4, wherein the dopants are P-type dopants.

7. The method of claim 3, further comprising the step of implanting a dopant after the second etching step to form a heavily doped first source/drain region and a lightly doped source/drain region under the step.

8. The method of claim 7, wherein the dopant is a N-type dopants.

9. The method of claim 7, wherein the dopant is a P-type dopants.

10. The method of claim 1, wherein the thickness of the first photoresist layer is thinner than the thickness of the second photoresist layer.

11. The method of claim 2, wherein the thickness of the first photoresist layer is thinner than the thickness of the second photoresist layer.

12. The method of claim 1, wherein the pattern of the second photoresist layer is smaller than the pattern of the first photoresist layer.

13. A method of producing a conductive structure of a semiconductor integrated circuit having stepped sidewalls, comprising the steps of:

forming an insulating layer over a substrate;

forming a conductive layer over the insulating layer;

completely removing portions of the conductive layer to form a remaining conductive layer; and partially etching regions on the remaining conductive layer so that the remaining conductive layer has two-tiered stepped sidewalls.

14. The method of claim 13, wherein the step of completely removing portions of the conductive layer forms an interconnect.

15. The method of claim 13, wherein the step of completely removing portions of the conductive layer forms a gate.

16. The method of claim 15, further comprising the step of forming a source/drain region in the substrate under the step of the gate.

17. A method of producing a conductive structure of a semiconductor integrated circuit having stepped sidewalls, comprising the steps of:

forming an insulating layer over a substrate;

forming a conductive layer over the insulating layer;

forming and patterning a first photoresist layer over the conductive layer;

etching the conductive layer to completely remove portions not covered by the patterned first photoresist layer and to form a remaining conductive layer;

removing the first photoresist layer;

forming and patterning a second photoresist layer over the remaining conductive layer;

etching partway through the remaining conductive layer;

removing the second photoresist layer;

forming sidewall oxide spacers in regions of the conductive layer where the conductive layer was etched partway through; and etching portions of the remaining conductive layer not covered by the sidewall oxide spacers.

18. The method of claim 17, wherein the step of etching part way through the remaining conductive layer forms an interconnect.

19. The method of claim 17, wherein the step of etching part way through the remaining conductive layer forms a gate.

20. The method of claim 19, further comprising the steps of:

lightly doping the substrate after removing the photoresist layer;

heavily doping the substrate after etching the exposed region of the remaining conductive layer.

21. The method of claim 20, wherein the sidewall oxide spacers are removed after the substrate is heavily doped.

22. A method of producing a conductive structure having stepped walls in a semiconductor integrated circuit, comprising:

forming an insulating layer over a substrate;

forming a conductive layer over the insulating layer;

forming a first photoresist layer over the conductive layer;

patterning the first photoresist layer to leave a first photoresist region over the conductive layer;

etching the conductive layer to completely remove portions of the conductive layer not covered by the first photoresist region and to form a remaining conductive layer;

removing the first photoresist region;

forming a second photoresist layer over the remaining conductive layer and the insulating layer;

patterning the second photoresist layer to form a second photoresist region located only over the remaining conductive layer, the second photoresist region being smaller than the first photoresist region;

partially etching portions of the remaining conductive layer not covered by the second photoresist region to form a step; and removing the second photoresist region.

23. The method of claim 22, wherein the thickness of the first photoresist layer is thinner that the thickness of the second photoresist layer.

24. The method of claim 22, wherein the step of partially etching portions of the remaining conductive layer forms an interconnect.

25. The method of claim 22, wherein the step of partially etching portions of the remaining conductive layer forms a gate.

26. The method of claim 25, wherein the substrate is heavily doped after removing the remaining first photoresist region to form a first source/drain region and lightly doped after removing the remaining second photoresist region to form a second source/drain region.

* * * * *